(12) United States Patent
Cao

(10) Patent No.: US 7,190,906 B2
(45) Date of Patent: Mar. 13, 2007

(54) LINEAR FULL-RATE PHASE DETECTOR AND CLOCK AND DATA RECOVERY CIRCUIT

(75) Inventor: Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 178 days.

(21) Appl. No.: 10/930,980

(22) Filed: Aug. 31, 2004

(65) Prior Publication Data

US 2005/0135813 A1 Jun. 23, 2005

Related U.S. Application Data

(63) Continuation of application No. 09/784,419, filed on Feb. 15, 2001, now Pat. No. 6,909,852.

(60) Provisional application No. 60/183,169, filed on Feb. 17, 2000.

(51) Int. Cl.
  *H04B 10/00* (2006.01)
(52) U.S. Cl. .................. 398/155; 370/217; 370/218
(58) Field of Classification Search ........ 370/217–220, 370/225, 242–244, 248–50, 395.1, 395.21, 370/395.43, 419, 428; 398/155
  See application file for complete search history.

(56) References Cited

U.S. PATENT DOCUMENTS

| 4,535,459 A | 8/1985 | Hogge, Jr. | |
|---|---|---|---|
| 5,301,196 A * | 4/1994 | Ewen et al. | 370/518 |
| 5,619,148 A * | 4/1997 | Guo | 327/3 |
| 5,923,455 A | 7/1999 | Rokugawa | |
| 6,121,804 A | 9/2000 | Bryan et al. | |
| 6,570,946 B1 | 5/2003 | Homol et al. | |

FOREIGN PATENT DOCUMENTS

| WO | WO 01/06696 | 1/2001 |
|---|---|---|
| WO | WO 01/63767 | 8/2001 |

OTHER PUBLICATIONS

U.S. Appl. No. 09/955,693, filed Sep. 18, 2001, Cao.

(Continued)

*Primary Examiner*—David C. Payne

(57) ABSTRACT

Method and apparatus for recovering a clock and data from a data signal. One method of the invention includes receiving the data signal having a first data rate and receiving a clock signal having a first clock frequency, and alternating between a first level and a second level. The data signal is stored when the clock signal alternates from the first level to the second level, and the stored data signal is provided as a first signal a first amount of time later. The first signal is stored when the clock signal alternates from the first level to the second level, and the stored first signal is provided as a second signal a second amount of time later. A third signal is provided by delaying the first signal for a third amount of time. The third signal is stored when the clock signal alternates from the second level to the first level, and the stored third signal is provided as a fourth signal a fourth amount of time later. A fifth signal is provided by delaying the data signal a fifth amount of time. An error signal is generated by taking the exclusive-OR of the first and fifth signals; and a reference signal is generated by taking the exclusive-OR of the second and fourth signals. The first data rate is equal to the first clock frequency.

20 Claims, 11 Drawing Sheets

OTHER PUBLICATIONS

Hogge, Jr., "A Self Correcting Clock Recovery Circuit", IEEE Journal of Lightwave Technology, vol. LT-3, No. 6, Dec. 1985.

Mullner, "A 20 Gb/s Parallel Phase Detector and Demultiplexer Circuit in a Production Silicon Bipolar Technology with fT=25GHz", Proc. IEEE BCTM, pp. 43-45, Oct. 1996.

Rau et al., "Clock/Data Recovery PLL Using Half-Frequency Clock", IEEE Journal of Solid-State Circuits, vol. 32, No. 7, Jul. 1997.

Nakamura et al., "A 6 Gb/s CMOS Phase Detecting DEMUX Module Using Half-Frequency Clock", IEEE 1998 Symposium on VLSI Circuits Digest of Technical Papers.

Wurzer et al., "40 Gb/s Integrated Clock and Data Recovery Circuit in a Silicon Bipolar Technology", IEEE BCTM 8.1, 1998.

Savoj et al., "A-10 Gb/s CMOS Clock and Data Recovery Circuit", IEEE 2000 Symposium on VLSI Circuits Digest of Technical Papers.

* cited by examiner

FIG. 11  1100

1110 — PROVIDE A DATA INPUT AND A CLOCK INPUT HAVING RISING AND FALLING EDGES.

1120 — STORE THE DATA INPUT IN A FIRST FLIP-FLOP ON THE CLOCK FALLING EDGES.

1130 — STORE THE OUTPUT OF THE FIRST FLIP-FLOP IN A THIRD FLIP-FLOP ON THE CLOCK FALLING EDGES.

1140 — DELAY THE OUTPUT OF THE FIRST FLIP-FLOP.

1150 — STORE THE DELAYED OUTPUT OF THE FIRST FLIP-FLOP IN A SECOND FLIP-FLOP ON THE CLOCK RISING EDGES.

1160 — XOR THE DATA AND THE FIRST FLIP-FLOP OUTPUT TO GENERATE AN ERROR SIGNAL.

1170 — XOR THE OUTPUTS OF THE SECOND AND THIRD FLIP-FLOPS TO GENERATE A REFERENCE SIGNAL.

LINEAR FULL-RATE PHASE DETECTOR AND CLOCK AND DATA RECOVERY CIRCUIT

CROSS-REFERENCE TO RELATED APPLICATIONS

This application is a continuation of U.S. application Ser. No. 09/784,419, filed Feb. 15, 2001 now U.S. Pat. No. 6,909,852, which claims priority of U.S. Provisional Application No. 60/183,169, filed Feb. 17, 2000, which are hereby incorporated by reference.

BACKGROUND OF THE INVENTION

The present invention relates generally to phase-locked loops, and more specifically to linear full-rate phase detectors and clock and data recovery circuits.

Data networking has exploded over the last several years, and has changed the way people work, get information, and spend leisure time. Local Area Networks (LANs) in the workplace allow for centralized database and file sharing and archiving. Wireless Application Protocol (WAP) enabled mobile phones operating over a Wide Area Network (WAN) allow users to access news updates and stock quotes. The Internet has transformed shopping and research, and has spawned a new recreational activity—Web surfing. Many computers are used primarily as interfaces to these networks, thus the expression "the network is the computer" has become popularized.

Devices such as Network Interface Cards (NICs), bridges, routers, switches, and hubs move data between users, between users and servers, or between servers. Data moves over a variety of media such as fiber optic or twisted pair cables, and the air. These media are similar in that they distort data, making it difficult to be read by a receiving device. Light-waves in a fiber optic cable travel not only down the cable's core, but bounce off the core-cladding interface, and thus tend to disperse. Twisted pair cables have filtering properties that tend to attenuate higher frequencies. This limited bandwidth also creates interference between individual data bits, known as Inter-Symbol Interference (ISI). Wireless signals tend to bounce off buildings and other surfaces in a phenomenon known as multipath, which results in the smudging of one data bit into the next.

Therefore, each of these devices, NICs, bridges, routers, switches, and hubs, receive distorted data and must "clean it up", or retime it, for use either by the device itself, a device attached to it, or for re-transmission. A useful building block for this is the phase-locked loop (PLL). PLLs accept distorted data, and provide a CLOCK signal and retimed (or recovered) data as outputs.

But the task for PLLs has lately begun to be a lot tougher. Equipment operating at data rates of one Gigabit per second is replacing 100 Megabit devices, which recently replaced 10 Megabit units. Exacerbating this problem is the competitive nature of the networking business itself. Pricing pressures are enormous, and using high speed, specialized processes raises system costs. Thus, the goal is to create integrated circuits that are capable of operating at these data rates, but which can be made using relatively inexpensive process technologies. What is needed are PLLs which can be made inexpensively, while still operating at these high frequencies.

SUMMARY OF THE INVENTION

Accordingly, the present invention provides a phase detector having relaxed timing requirements that allow the use of less costly processes. Specifically, the insertion of a delay element in a phase detector consistent with the present invention separates the signal paths for error and reference signal generation. In the absence of the delay, data must be transferred from one flip-flop to another in one-half a clock period. With the addition of a delay approximately equal to one-half a clock cycle, the transfer has almost an entire clock period in which to occur. In addition, another flip-flop is added to accommodate the timing requirements and to provide better matching of the critical high speed signals.

An exemplary embodiment of the present invention provides a method including receiving the data signal having a first data rate and receiving a clock signal having a first clock frequency, and alternating between a first level and a second level. The data signal is stored when the clock signal alternates from the first level to the second level, and the stored data signal is provided as a first signal a first amount of time later. The first signal is stored when the clock signal alternates from the first level to the second level, and the stored first signal is provided as a second signal a second amount of time later. A third signal is provided by delaying the first signal for a third amount of time. The third signal is stored when the clock signal alternates from the second level to the first level, and the stored third signal is provided as a fourth signal a fourth amount of time later. A fifth signal is provided by delaying the data signal a fifth amount of time. An error signal is generated by taking the exclusive-OR of the first and fifth signals; and a reference signal is generated by taking the exclusive-OR of the second and fourth signals. The first data rate is equal to the first clock frequency.

A further embodiment of the present invention provides an apparatus for recovering data from a received data signal. The apparatus includes a first storage device configured to generate a first signal by receiving and storing the received data signal, a second storage device configured to generate a second signal by receiving and storing the first signal, and a first delay block configured to generate a third signal by delaying the first signal. This embodiment also provides for a third storage device configured to generate a fourth signal by receiving and storing the third signal, a second delay block configured to generate a fifth signal by delaying the received data signal, a first logic gate configured to perform an exclusive-OR of the second and fourth signals, and a second logic gate configured to perform an exclusive-OR of the first and fifth signals. When the first storage device stores the received data, the second storage device stores the first signal, and the third storage device does not store the third signal. When the third storage device stores the third signal, the first storage device does not store the received data, and the second storage device does not store the first signal.

Yet a further exemplary embodiment of the present invention provides an apparatus for recovering data from a received data signal. The apparatus includes a first flip-flop having a data input coupled to a first data input port, and a clock input coupled to a first clock port, a second flip-flop having a data input coupled an output of the first flip-flop, and a clock input coupled to the first clock port; and a first delay element having an input coupled to the output of the first flip-flop. This embodiment also provides a third flip-flop having a data input coupled to an output of the first delay element, and a clock input coupled to a second clock port, as well as a second delay element having an input coupled to the first data input port. A first exclusive-OR gate having a first input coupled to the output of the second flip-flop, and a second input coupled to an output of the third flip-flop, and a second exclusive-OR gate having a first input coupled to the output of the first flip-flop and a second input coupled to the second delay element, are also included. The signal at the second clock port is the complement of the signal at the first clock port.

A better understanding of the nature and advantages of the present invention may be gained with reference to the following detailed description and the accompanying drawings.

BRIEF DESCRIPTION OF THE DRAWINGS

FIG. 11 is a flowchart of a method of recovering data and clock signals consistent with the present invention.

DESCRIPTION OF THE SPECIFIC EMBODIMENTS

Figure 1:
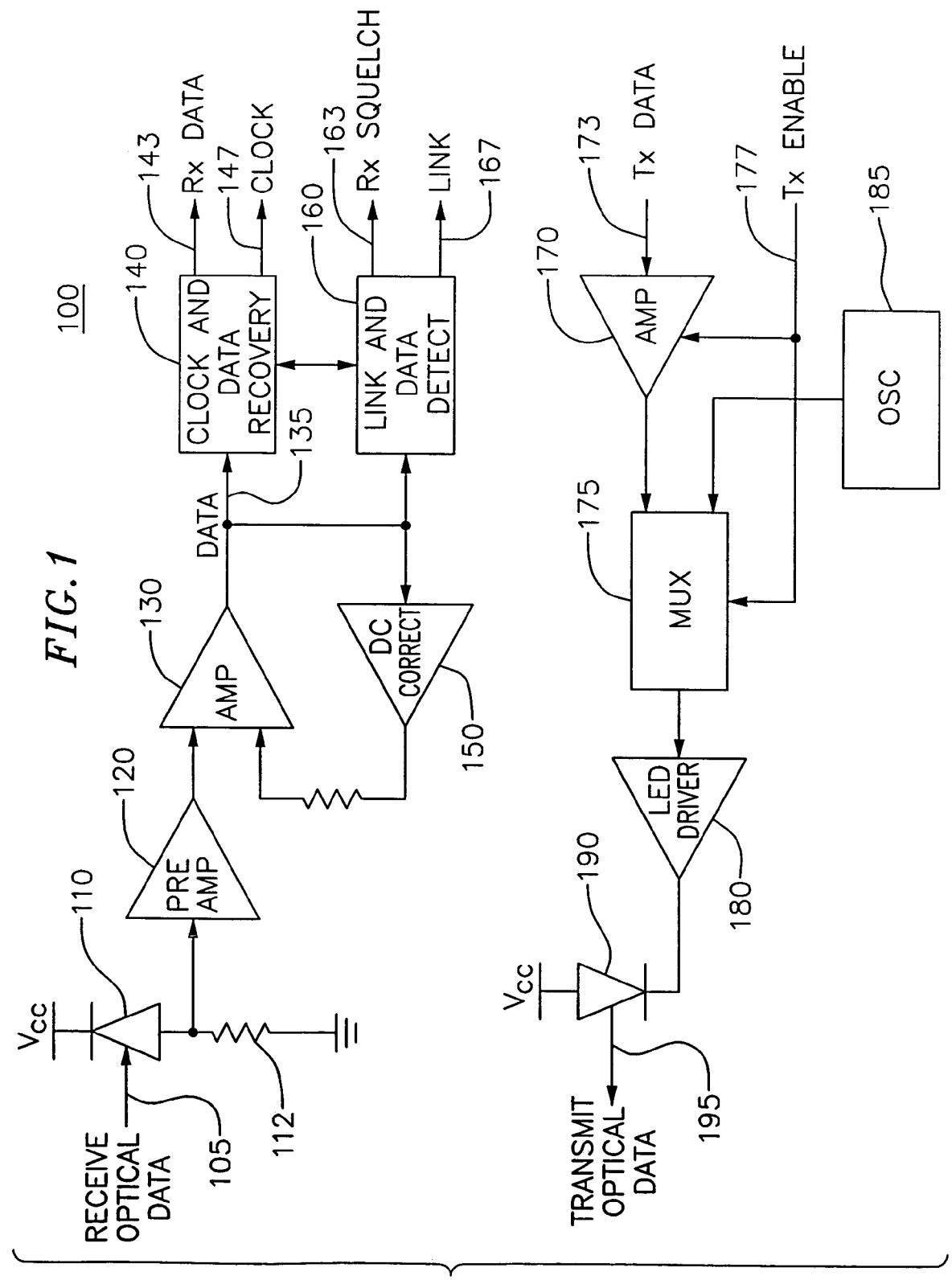
FIG. 1 is a block diagram of an exemplary optical transceiver that incorporates one embodiment of the present invention.

FIG. 1 is an exemplary block diagram of an optical transceiver which incorporates one embodiment of the present invention. This figure, as with all the included figures, is for illustrative purposes, and does not limit the possible applications of the present invention, or limit the appended claims. This optical transceiver may be on a NIC card with a media access controller, some memory, and other circuits. Included is a receive path including a photo diode 110, sensing resistor 112, pre-amplifier 120, amplifier 130, DC offset correction circuit 150, clock and data recovery circuit 140, and link and data detect 160. A transmit path having an amplifier 170, Light Emitting Diode (LED) driver 180, multiplexer 175, oscillator 185, and LED 190 is also shown. Instead of the LED driver 180 and LED 190, the light emitting subsystem may also consist of a laser driver and laser diode.

A receive fiber optic cable 105 carries an optical data signal to the reversed-biased photo diode 110. Photo diode 110 senses the amount of light from fiber optic cable 105, and a proportional leakage current flows from the device cathode to anode. This current flows though sense resistor 112, thus generating a voltage. This voltage is amplified by pre-amplifier 120, and sent to amplifier 130. DC offsets are reduced by DC correction circuit 150. The output of the amplifier 130 drives the clock and data recovery circuits 140, as well as the link and data detect block 160. The clock and data recovery circuits extract the CLOCK signal embedded in the data provided on line 135 by the amplifier, and uses it to retime the data for output on lines 143. If the link and data detect block 160 senses either a data or link signal at the data line 135, a valid link signal is asserted on line 167. If the link and data detect block 160 senses a data signal at the data line 135, a receive squelch signal is de-asserted on line 163.

Transmit data is provided on line 173 to amplifier 170. Amplifier 170 is enabled by the transmit enable signal on line 177. When amplifier 170 is enabled, transmit data is passed to the multiplexer 175. Multiplexer 175 passes the transmit data to the LED driver 180 which in turn generates a current through light emitting diode (LED) 190. When current is driven through LED 190, light is emitted and transmitted on fiber optic cable 195. When the LED driver 180 is not driving current though LED 190, the LED is off, and the fiber optic cable 195 is dark. If the amplifier 170 is disabled, multiplexer 175 selects the idle signal from oscillator block 185. Oscillator block 185 provides an idle signal through the multiplexer 175 to the LED driver 180. This idle signal is used by the receiver to ensure that a valid optical connection has been made at both ends of the fiber-optic cable 105.

As discussed above, the physical media limitations distort the received signal. Moreover, the delay through the amplifier 170, multiplexer 175, LED driver 180, and LED 190 may not be the same for a light-to-dark as for a dark-to-light transition. This mismatch causes what is referred to as a duty cycle distortion. Further, electrical noise in the power supply and data path create jitter and phase noise, which is where the delay through the transmitter changes as a function of time. It is the function of clock and data recovery circuits, such as block 140, to retime the data so it is in a more useable form for further data processing, and provide a CLOCK synchronized to the data.

Figure 2:
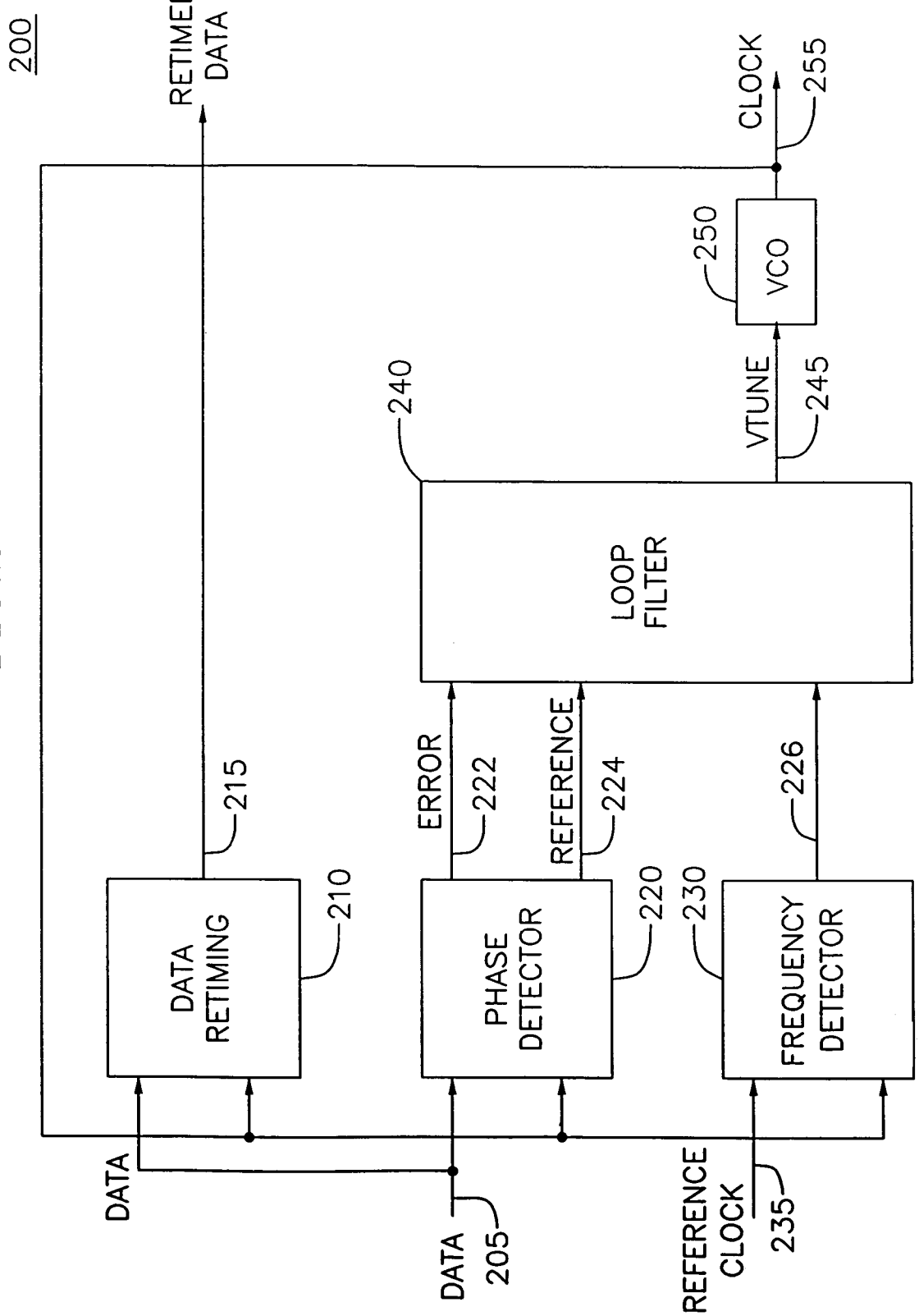
FIG. 2 is a block diagram of a clock and data recovery circuit consistent with one embodiment of the present invention.

FIG. 2 is a simplified block diagram of a clock and data recovery circuit, also known as a phase-locked loop, consistent with one embodiment of the present invention. This architecture is shown for exemplary purposes, and does not limit either the possible applications of the present invention, or the appended claims. Other architectures will be readily apparent to those skilled in the art. For example, the retiming block 210 may be included in the phase detector 220. Further the phase detector 220 and frequency detector 230 may be the same circuit under the control of a mode switch. Included in this figure are retiming block 210, phase detector 220, frequency detector 230, loop filter 240, and VCO 250.

At startup, the loop adjusts the VCO to the correct frequency. Startup may be initiated by the power supply turning on, by the reception of a valid link by the receiver, or other appropriate event. A reference clock is provided on lines 235 to the frequency detector 230. The reference clock is a comparatively low-frequency signal generated by a stable oscillation source, for example a crystal. The output of the VCO 250, the CLOCK signal on lines 255, is typically divided down by an integral number and compared to the reference clock by the frequency detector 230. The CLOCK signal may be single-ended or differential. If the CLOCK signal is single-ended, lines 255 are simply one line. The output of the frequency detector 230 provides an output voltage which is filtered by the loop filter 240, and provided to the VCO 250 as tuning voltage VTUNE 245. If the frequency of the CLOCK signal on lines 255 is too high, the frequency detector 230 changes its output voltage, and VTUNE on line 245, in such a direction as to lower the CLOCK signal's frequency. Conversely, if the CLOCK signal on lines 255 is too low in frequency, the frequency detector 230 changes its output voltage, and VTUNE on lined 245, in such a direction as to raise the CLOCK signal's frequency.

Once the CLOCK signal on lines 255 is tuned to the correct frequency, the phase detector 220 becomes active, and the frequency detector 230 becomes inactive. A DATA signal is received by the data retiming block 210 and phase detector 220 on lines 205. The DATA signal may be single-ended or differential. If the DATA signal is single-ended, line 205 is simply one line. Phase detector 220 compares transitions in the DATA signal on lines 205 to the rising edges of the CLOCK signal on lines 255, and produces an ERROR signal on line 222 that is proportional to the phase relationship between them. Alternately, the phase detector 220 can be designed so that the transitions in the DATA signal are compared to the falling edges of the CLOCK signal. The ERROR signal may be single-ended or differential. If the ERROR signal is single-ended, line 222 is simply one line. Phase detector 220 also produces a REFERENCE signal on line 224 that can be subtracted from the ERROR signal to generate a data pattern independent correction signal. The REFERENCE signal may be single-ended or differential. If the REFERENCE signal is single-ended, line 224 is simply one line. The ERROR and REFERENCE signals are filtered by the loop filter 240 resulting in a voltage VTUNE 245.

As its name implies, the voltage controlled oscillator is an oscillator, the frequency of which is controlled by VTUNE. As VTUNE changes, so does the oscillation frequency. If the DATA on lines 205 and the CLOCK on lines 255 do not have the desired phase relationship, the error voltage, and thus VTUNE, changes in the direction necessary to adjust the VCO in order to correct the phase error. Specifically, if the DATA signal on lines 205 comes too soon, that is, it is advanced in time relative to the CLOCK signal on lines 255, the phase detector increases the ERROR voltage on line 222. This results in a change in the VTUNE voltage 245 that increases the frequency of the CLOCK 255. As the frequency of the CLOCK signal on lines 255 increases, its edges come sooner in time, that is they advance. This in turn, brings its rising edges into alignment with transitions in the data signal on lines 205. As the edges move into alignment, the error signal on line 222 reduces, changing VTUNE 245, thereby reducing the frequency of the CLOCK signal on lines 255. This feedback insurers that the DATA and CLOCK signals have the proper phase relationship for the retiming of the data by retiming block 210. In this condition the loop is said to be locked. Hence, these clock and data recovery circuits are often referred to as phase-locked loops, or PLLs.

The ERROR signal on line 222 and the REFERENCE signal on line 224 provide a relatively low frequency, essentially differential, correction signal. This provides several important benefits. For example, the use of a REFERENCE signal gives context to the ERROR signal, reducing the data dependent phase errors which would otherwise result. If there are no data transitions this loop has no ERROR or REFERENCE signal information to use to lock, but since there is also no data to recover, this special case is of no interest.

Also, conventional systems often employ what is known as a "bang-bang" phase detector. In bang-bang detectors, for each data edge, depending on its relation to the clock, a charge-up or charge-down signal is sent to a charge pump. Such detectors alternate between advancing and delaying the clock signal from the VCO, and never reach a stable point. Accordingly, bang-bang detectors always have a certain amount of systematic jitter. Moreover, these pulses have fast edges containing high frequency components that couple to the supply voltage and inject noise into other circuits. Reducing this noise requires either filtering, or using separate supply lines decoupled from each other. By using a low frequency, effectively differential signal out, the linear full-rate phase detector of the present invention does not have this systematic jitter, and does not disturb the power supply and other circuits to the same extent.

Figure 3:
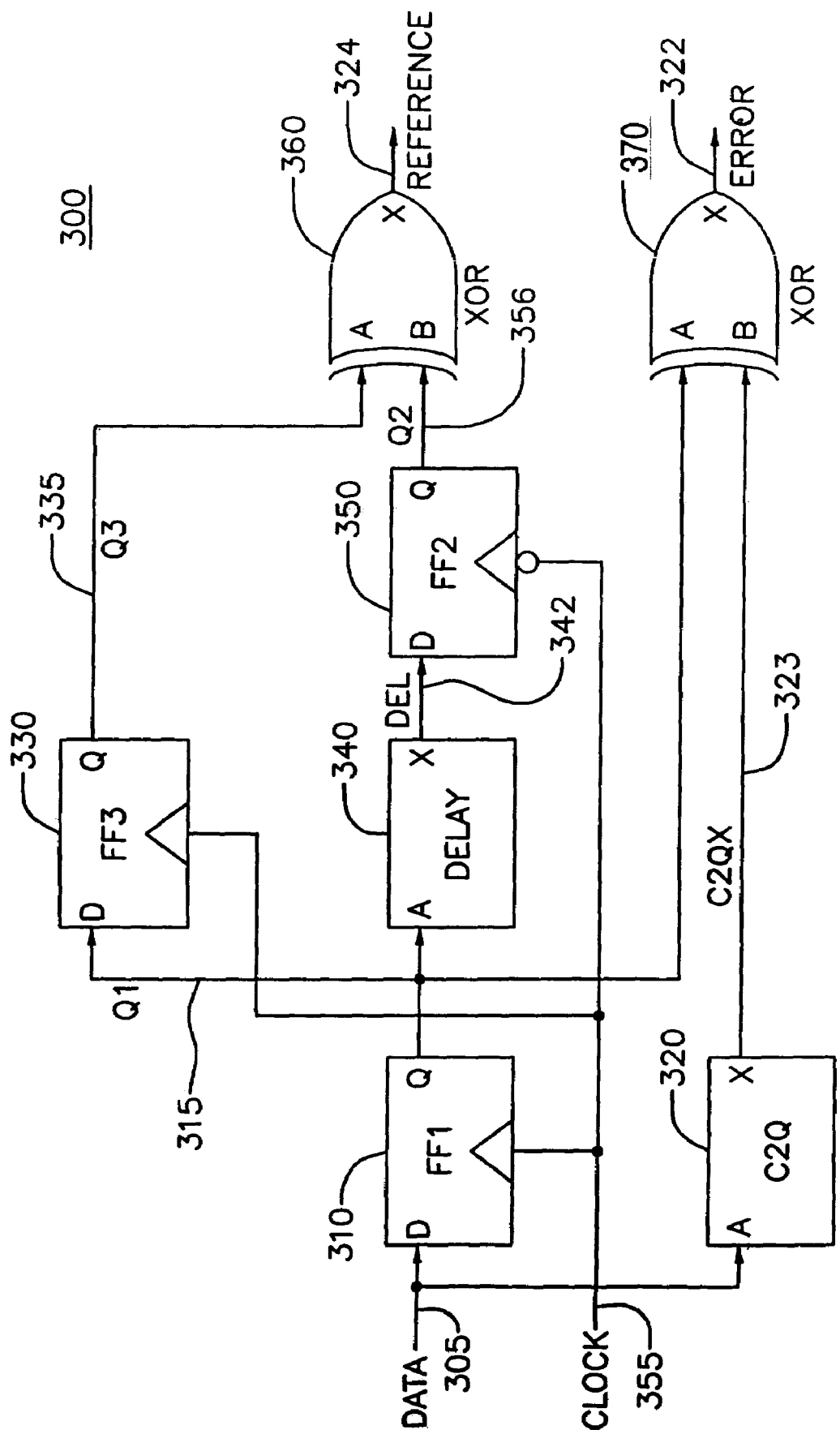
FIG. 3 illustrates a block diagram a full-rate phase detector consistent with one embodiment of the present invention.

FIG. 3 is a block diagram 300 of a phase detector consistent with one embodiment of the present invention. This phase detector may be used as the phase detector 220 in FIG. 2. Alternately, it may be used in other PLL architectures. For example, it may be used in an architecture with a charge pump between the phase detector and loop filter. The phase detector shown may be used in a PLL in a fiber optic transceiver, as shown in FIG. 1. Alternately, it may be used in a PLL in other systems. Phase locked-loops are particularly important where a data processing system interfaces with a physical medium. Accordingly, this phase detector may be used in PLLs in twisted pair or coaxial transceivers, disk-drive or other mass-storage read channels, wireless receivers, routers, NICs, bridges, switches, hubs, and other similar circuits.

Included in block diagram 300 are first flip-flop 310, a second flip-flop 350, third flip-flop 330, delay block 340, C2Q delay 320, and XOR gates 360 and 370. The flip-flops are negative-edge triggered devices. Specifically, the first flip-flop 310 and third flip-flop 350 change state on the falling edges of the clock, while the second flip-flop changes state on the rising edges of the clock. Alternately, positive-edge triggered devices may be used. If negative-edge triggered devices are used, the phase detector aligns the data transitions to the clock rising edges. If positive-edge triggered devices are used, the phase detector aligns the data transitions to the clock falling edges. All signal paths shown may be differential or single-ended. For example, Q1 may be a differential signal including the first flip-flop 310 output signals Q and its complement, QBAR. In a preferred embodiment, all signal paths are differential. Using differential signals reduces the jitter caused by noise from such sources as the power supply and bias lines. Modifications to this block diagram will be readily apparent to one skilled in the art. For example, the third flip-flop 330 may be replaced with a matching delay element.

DATA on line 305 is received by the first flip-flop 310 and C2Q delay block 320. In a preferred embodiment, the delay through the C2Q delay block approximately equals the clock-to-Q delay of the first flip-flop 310. The clock-to-Q delay for a flip-flop is the delay of the output changing in response to a clock edge. The first flip-flop 310 is clocked by the CLOCK signal on lines 355 from a VCO or other oscillating circuit. On each CLOCK falling edge, the data on lines 305 is latched by the first flip-flop 310 and held at the Q output as signal Q1 on line 315. The signal Q1 on line 315 is stored in the third flip-flop 330 on each falling edge of the CLOCK 355, delayed by the delay block 340, and applied as an input to XOR gate 370. The output of the C2Q delay block 320, C2QX on line 323, is applied to the B input of XOR gate 370. The output of the XOR gate 370 is the ERROR signal on line 322. The output of the delay block 340, DEL on line 342, is stored in the second flip-flop on every CLOCK rising edge. The output of the third flip-flop 330, Q3 on line 335, is applied to the A input of XOR gate 360. The output of the second flip-flop 350, Q2 on line 356, is coupled to the B input of XOR gate 360. The output of XOR gate 360 is the REFERENCE signal on line 324.

The signal delay duration provided by delay block 340 is greater than one-half a CLOCK cycle, less the clock-to-Q delay of the first flip-flop 310, plus the hold time of the second flip-flop 350. This duration is also less than one and one-half CLOCK cycles (three transitions of the clock), less the clock-to-Q delay of flip-flop 310, less the set-up time of the second flip-flop 350. The set-up time is the time that data must be present at a flip-flop's input before a clock signal edge to ensure that the data is properly clocked into the flip-flop. The hold time is the time that data must be present at a flip-flop's input after a clock signal edge to ensure that the data is properly clocked into the flip-flop. The delay through the delay block 340 decouples the signal path used to generate the REFERENCE signal on line 324 from the signal path used to generate the ERROR signal on line 322. Without the delay block 340, the output of the first flip-flop 310, Q1 on line 315, would couple directly to the D input of the second flip-flop 350. But this would mean the data signal would have to be clocked out of the first flip-flop 310 and into the second flip-flop 350 in less than one-half a CLOCK cycle. This demanding timing requires using a great deal of power in both the first flip-flop 310 to reduce its clock-to-Q delay, and the second flip-flop 350 to reduce its set-up time. For some inherently slower technology, such as a standard CMOS process, it may simply be impossible to meet this timing requirement. With the addition of the delay block 340, the most demanding timing path is from the output of the first flip-flop 310 into the third flip-flop 330. But there is an entire CLOCK cycle for this to occur, which is a much less stringent criteria.

To improve performance, some circuit delay times and trace paths should be matched to each other. Specifically, the first flip-flop's clock-to-Q delay and the trace coupling the first flip-flop 310 to the XOR gate 370 should match the delay through the C2Q block 320 and the trace coupling the C2Q block 320 and the XOR gate 370. Also, the second flip-flop's clock-to-Q and the trace coupling the second flip-flop 350 to the XOR gate 360 should match the third flip-flop's clock-to-Q delay and the trace coupling the third flip-flop 330 to the XOR gate 360. By employing identical second and third flip-flops 350 and 330, and identical XOR gates 360 and 370, one can easily achieve an almost perfect match between the two signals generating the REFERENCE signal. But it is more difficult to match the clock-to-Q delay of the first flip-flop 310 with a delay element such as the C2Q delay 320. However, by decoupling the generation of the REFERENCE and ERROR signals, the difficult matching of the two signals producing the ERROR information can be independently adjusted and optimized. Better matching ensures that if the DATA signal transitions are aligned with the CLOCK rising edges, then the resulting ERROR and REFERENCE signal pulses match. To adjust these delays, one embodiment of the present invention has extra devices which may be configured as capacitors. These capacitors may be connected to a signal path in order to slow a signal down, such that it matches another signal more accurately. For example, one embodiment has capacitors on the C2QX traces 323, so that the delay from the C2Q block 320 to the XOR gate 370 matches the delay from the first flip-flop 310 to the XOR gate 370.

Figure 4:
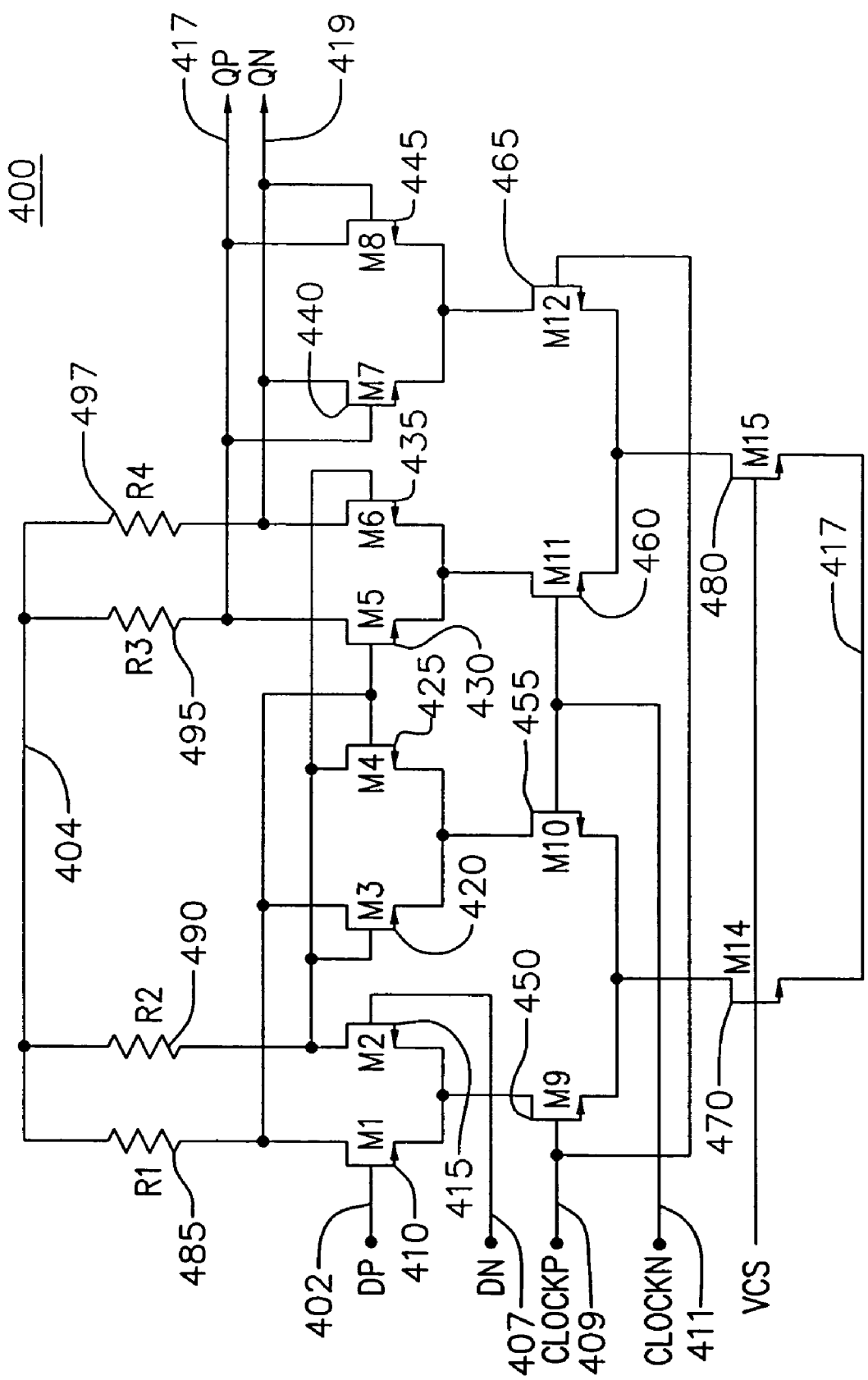
FIG. 4 is a schematic of a flip-flop which may be used in the full-rate phase detector of FIG. 3.

FIG. 4 is a schematic for an exemplary circuit implementation of a negative-edge triggered flip-flop which may be used as the first flip-flop 310, the second flip-flop 350, or the third flip-flop 330 in FIG. 3. It will be obvious to one skilled in the art that other flip-flops can be used, for example a bipolar flip-flop could be used. Alternately, a flip-flop with current source loads, or source follower outputs could be used. The flip-flop is made up of 2 latches in series. Included are an input differential pair of the first latch M1 410 and M2 415, latching devices M3 420 and M4 425, and CLOCK pair M9 450 and M10 455. Also included are the input differential pair of the second latch M5 430 and M6 435, latching pair M7 440 and M8 445, and CLOCK pair M11 460 and M12 465. Load resistors R1 485, R2 490, R3 495, R4 497, current sources M14 470 and M15 480 are also shown.

Bias voltage VCS is applied to the gates of M14 470 and M15 480 relative to their sources, which are coupled to line 417. This bias voltage generates currents in the drains of M14 470 and M15 480. When the CLOCK signal is high, that is the signal level of CLOCKP on line 409 is higher than the signal level of CLOCKN on line 411, the first latch is in the pass mode and the second latch is in the latched mode. Specifically, the drain current of M14 470 is passed through M9 450 to the input differential pair M1 410 and M2 415, and the drain currents of M15 passes through device M16 465 to the latching pair M7 440 and M8 445. If the voltage at D is high, that is the voltage on line DP 402 is higher than the voltage DN on line 407, the drain current of M9 flows through device M1 410 and into load resistor R1 485, thereby lowering the voltage at the drain of M1 410. The device M2 415 is be off, and so the voltage at its drain is high. If the voltage at QN on line 419 is high, the drain current from M12 465 passes through device M8 445 across the third load resistor R3 495, and so QN remains high.

When the CLOCK signal is low, that is the signal level of CLOCKN on line 411 is lower than the signal CLOCKP on line 409, the drain current of M14 470 passes through M10 455, and the drain current of M15 480 passes through device M11 460. If the signal level at DP had previously been high such that the voltage at the drain of M1 410 had been low, the drain current of M10 455 passes through the device M3 420 across the load resistor 485, thus keeping the voltage at that node low. Furthermore the latch pair M7 440 and M8 445 are off, and input pair M5 4 30 and M6 4 35 are on, and follow the data signal provided by latch pair M3 420 and M4 425. Therefore, for each CLOCK falling edge, that is when the voltage on line 411 exceeds in the voltage on line 409, the data at the input port DP and DN is latched by the first latch and output by the second latch on lines QP 417 and QN on line 419.

If this flip-flop is used for the flip-flops in FIG. 3, the following should be noted. If the signals are differential, DP, CLOCKP and QP correspond to the D, clock, and Q ports of the flip-flops in FIG. 3. For the second flip-flop 350, the CLOCKP and CLOCKN connections should be reversed relative to the other flip-flops, as indicated by the circle at its clock input. If single-ended signals are used, DN and CLOCKN (CLOCKP for the second flip-flop 350) should be coupled to bias voltages which preferably have a DC voltage equal to the average signal voltage at DP and CLOCKP (CLOCKN for the second flip-flop). This can be changed into a positive-edge triggered flip-flop by reversing the CLOCKP and CLOCKN lines.

Figure 5:
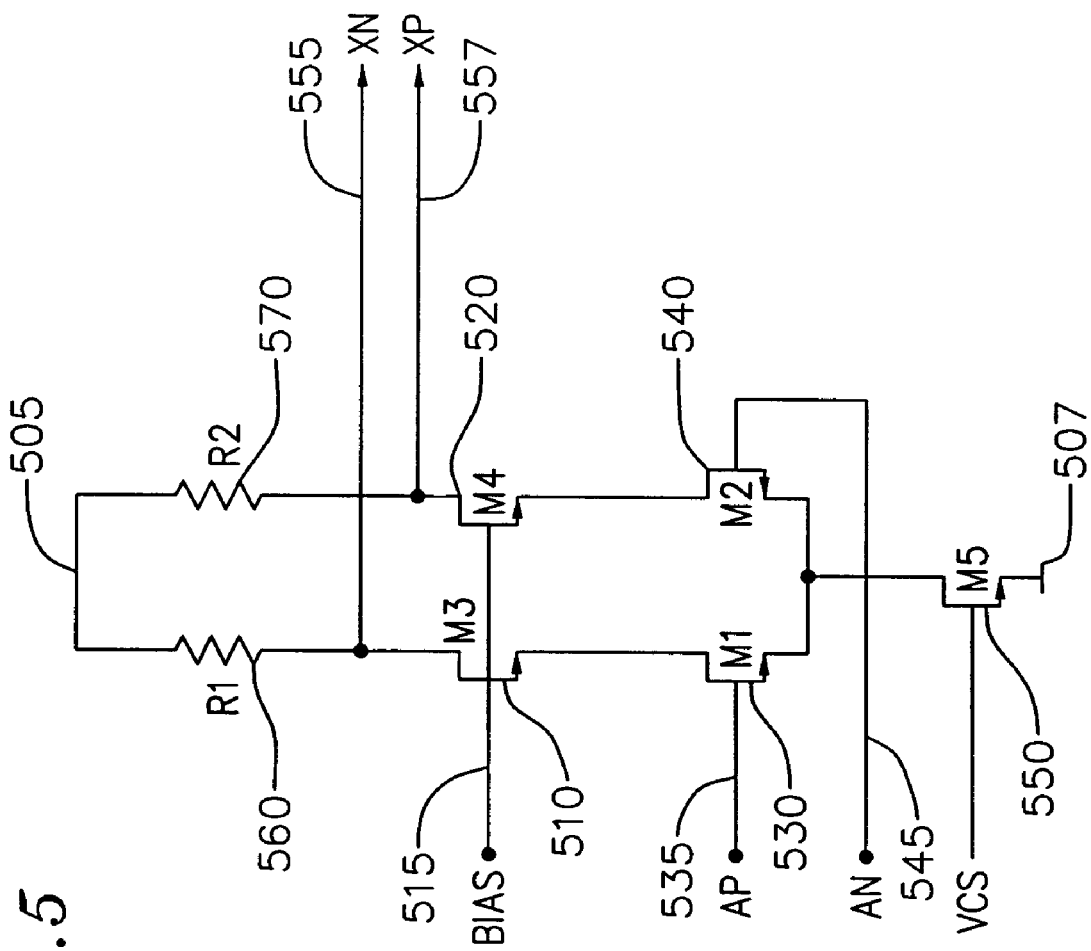
FIG. 5 is a schematic of a delay block which may be used in the full-rate phase detector of FIG. 3.

FIG. 5 is a schematic of an exemplary circuit implementation for a delay circuit that may be used for delay block 340 in FIG. 3. This same architecture can be used to implement the C2Q block 320 in FIG. 3 as well. It will be obvious to one skilled in the art that this delay block could be designed several different ways. For example, an RC network could be used. Included are input pair devices M1 530 and M2 540, cascode devices M3 510 and M4 520, load resistors R1 560 and R2 570, and current source device MS 550. An input signal is applied at the A port, AP on line 535 and AN on line 545, to the first input pair M1 530 and M2 540. A bias voltage VCS is applied to the gates of M5 relative to its source terminal that is coupled to line 507. VCS may be the same bias line as was used in FIG. 4. Alternately it may be a different bias voltage. This voltage generates a current in the drain of M5 550. If the voltage at the A port is high, that is the voltage on at signal AP on line 535 is higher than the signal level of AN on line 545, the drain current of M5 550 passes through the device M1 530, through cascode device M3 510, to the first load resistor R1 560, pulling the voltage XN on line 555 low. Conversely, if the signal at the A port is low, that is the voltage signal at AP is lower than the signal level at AN,.the drain current of M5 530 is passed through device M2 540, through cascode device M4 520, to the second load resistor R2 570, pulling output XP on line 557 low. In this way a signal applied to input port A on lines 535 and 545 results in a delayed signal appearing at lines at XP 557 and XN 555.

Figure 6:
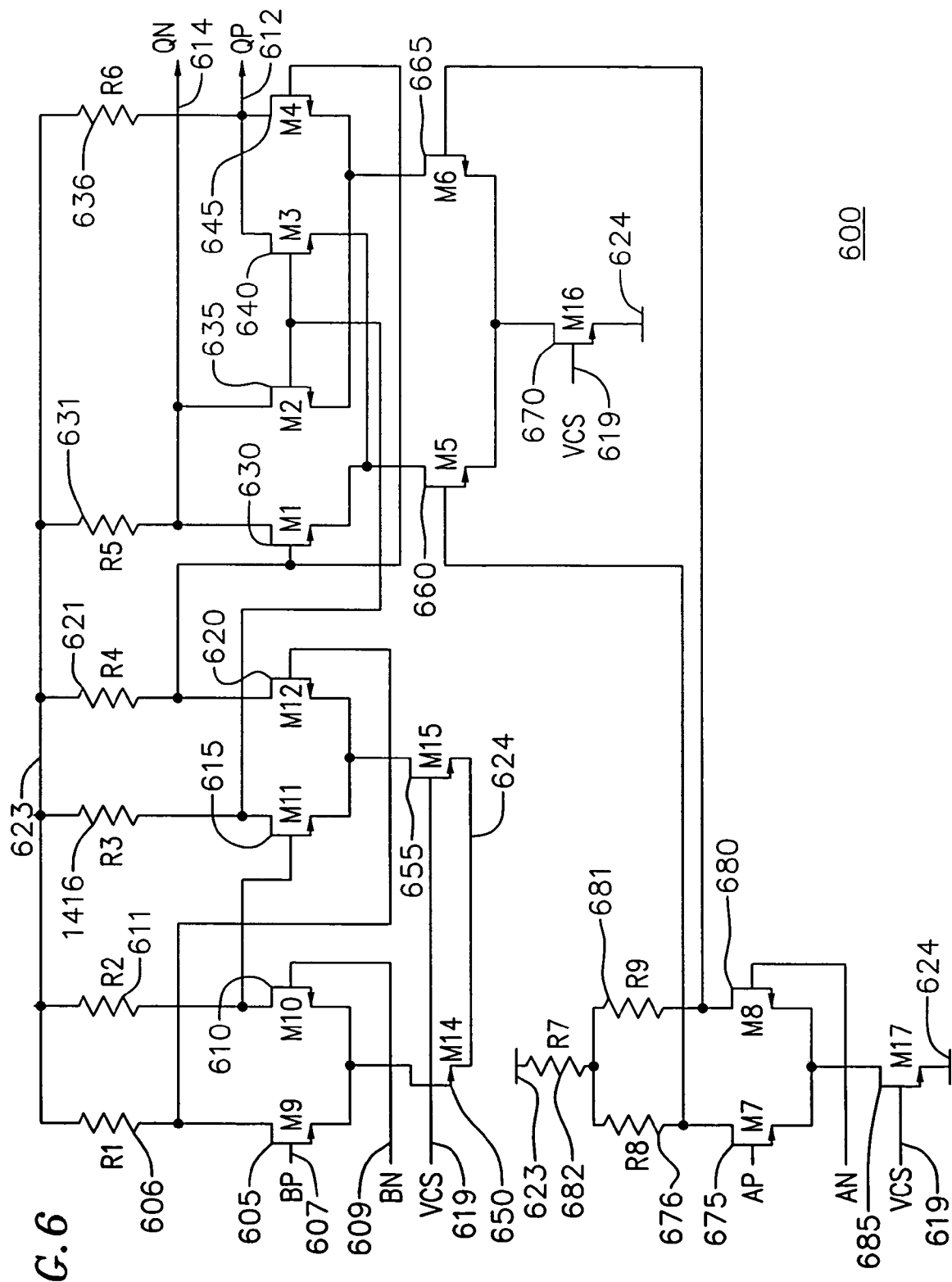
FIG. 6 is a schematic of an XOR gate which may be used in the full-rate phase detector of FIG. 3.

FIG. 6 and is an exemplary XOR gate that may be used with various embodiments of the present invention. For example, this XOR gate may be used as XOR gates 360 and 370 in FIG. 3. Alternately, other XOR gates may be used, such as a bipolar XOR gate. Included are B input buffers M9 605 and M10 610, and M11 615 and M12 620, and A input buffer M7 675 and M8 680. An XOR core made up of devices M1 630, M2 635, M3 640, M4 645, M5 660, and M6 665, is also shown. Current sources M14 650, M15 655, M16 670, and M17 685, are biased with a VCS voltage such that a current is produced in their drains. The VCS voltage applied to all these devices may be equal to each other. Alternately, different VCS voltages may be used for the buffers and the core. Further, the buffers may have differing VCS voltages.

Signals at the A input steer the drain currents of M16 670 through either M5 660 or M6 665. The signal at the B input steers the current to the load resistors thereby generating voltage outputs at QP and QN on lines 612 and 614. The connections are such that QP is high when the signal at either, but not both, the A input and the B input are high. To match the delay from input to output, two buffers are used in the B path, and one buffer is used in the A path. This is because the A input steers the lower devices M5 and M6, which then drive upper devices M1 through M4. But the B input drives devices M1 to M4 directly. Thus, to compensate for the delay through M5 660 and M6 665, an extra buffer is inserted in the B path. Resistor R7 682 lowers the common mode voltage of the output of the A input buffer, which improves the transient response of the lower differential pair M5 660 and M6 665.

An alternate embodiment for an XOR gate can be found in commonly assigned U.S. patent application Ser. No. 09/782,687, filed Feb. 12, 2001, titled "Linear Half-Rate Phase Detector and Clock and Data Recovery Circuit," which is incorporated by reference. Also, other architectures which may be used to implement some of the circuits herein can be found in commonly assigned U.S. patent application Ser. No. 09/484,856, filed Jan. 18, 2000, titled "C³MOS Logic Family," which is incorporated also herein by reference.

Figure 7:
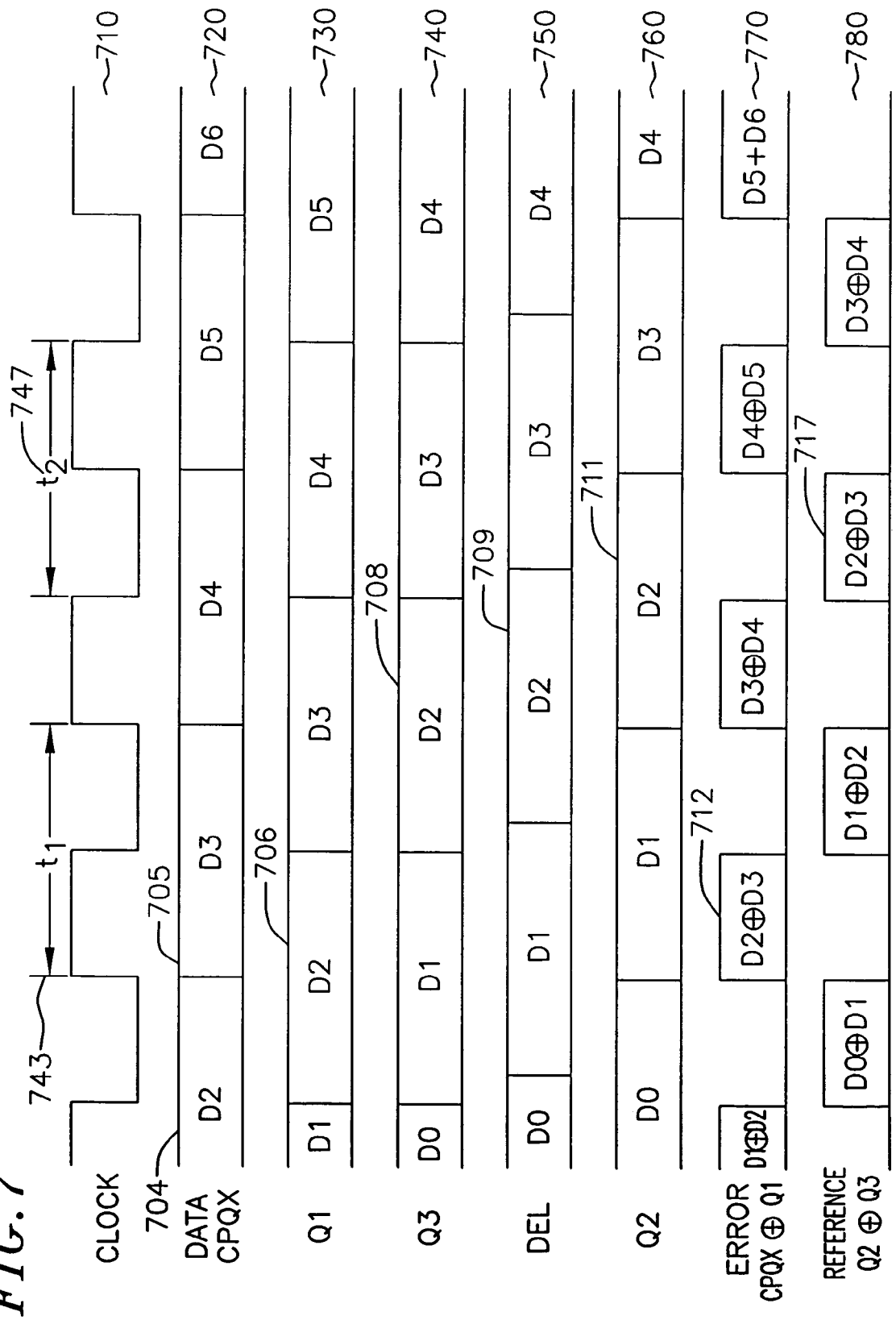
FIG. 7 is a generalized timing diagram a phase detector consistent with one embodiment of the present invention.

FIG. 7 is a timing diagram of some of the various signals in a phase detector consistent with one embodiment of the present convention, such as the block diagram of FIG. 3. This and the following timing diagrams are not limited to the circuit of FIG. 3 however, and may be generated by other circuitry consistent with the present invention. Included are inputs CLOCK 710 and DATA 720, and resulting signals Q1 730, Q3 740, DEL 750, Q2 760, ERROR 770, and REFERENCE 780. Data bits, such as 704 and 705, have a duration equal to one CLOCK cycle. Each data bit may be high or low, and the DATA signal 720 may transition or remain constant from one bit to the next.

Q1 730 is equal to the data signal 720 delayed in time and approximately aligned with the following falling edge of the CLOCK 710. There may be a delay between a transition of Q1 730 as compared to the falling edges of the CLOCK 710, particularly if Q1 is generated by a flip-flop (or register) clocked by falling edges of the CLOCK signal 710 and having the data signal 720 as its D input. Q3 740 is equal to Q1 730 delayed by one CLOCK cycle. There may be a delay between a transition of Q3 740 as compared to the falling edge of the CLOCK 710, particularly if Q3 is generated by a flip-flop (or register) clocked by falling edges of the CLOCK signal 710 and having Q1 730 as its D input. The signal DEL 750 is a delayed version of Q1 730. Q2 760 is equal to DEL 750 delayed and approximately aligned with the next rising edge of the CLOCK signal 710. There may be a delay between a transition of Q2 as compared to the rising edge of CLOCK 710, particularly if Q2 is generated by a flip-flop (or register) clocked by the rising edges of the CLOCK signal 710, and having DEL 750 as its D input.

The DATA signal 720 may be delayed an amount approximately equal to the delay of signal Q1 730 as compared to the CLOCK 710. This delayed data signal is referred to as CPQX in this timing diagram. For ease of explanation, all clock-to-Q delays are represented as zero, and therefore, the signal CPQX is shown as being equal to the DATA input 720. ERROR signal 770 is generated by XORing CPQX and Q1 730. REFERENCE signal 780 is generated by XORing Q2 760 and Q3 740.

For some time period after each falling edge of the CLOCK signal 710, the ERROR signal 770 is low. This is because at each falling edge of the CLOCK 710, Q1 730 follows the data signal 720. Accordingly, for some time period following each CLOCK falling edge Q1 730 and data 720 are equal in value. For example, in the time prior to the ERROR pulse 712, both CPQX and Q1 are in the state D2. Sometime later, the DATA signal 720 either transitions to a new level, or retains the same value. If DATA 720 changes to a new state, then DATA 720 and Q1 730 become unequal, and the ERROR signal 770 is high. If data signal 720 retains its value, however, ERROR signal 720 remains low. Specifically, if data bits D2 and D3 are equal, then ERROR bit 712 is low. But if data bits D2 and D3 are not equal, then ERROR bit 712 is high.

ERROR signal 770 is dependent on the phase relationship between DATA 720 and CLOCK 710 in the following manner. For example, if data bit 704 is low and data bit 705 is a high, then ERROR pulse 712 is high. If the DATA signal 720 advances, that is shifted to the left, then pulse 712 in the ERROR signal 770 widens (becomes longer in duration). If the DATA signal 720 is delayed, that is shifted to the right, then pulse 712 of ERROR signal 770 narrows (becomes shorter in duration). But note as above, if data pulse 704 and data pulse 705 are equal, then data pulse 712 is low. Therefore, the average ERROR voltage is dependent not only on the phase error between CLOCK 710 and DATA 720, but on the data pattern of DATA 720. For this reason, the ERROR signal 770 is most meaningful in the context of REFERENCE signal 780.

This is because the REFERENCE signal's average value is also data dependent. For some time period following each rising edge of CLOCK signal 710, the REFERENCE signal 780 is low, since at each rising edge of the CLOCK 710, Q2 760 is equal in value to Q3 740. For example, in the time prior before reference pulse 717, both Q3 and Q2 are in the state D2. In the next half CLOCK cycle Q3 has the value of the next data bit D3 while Q2 remains unchanged. Therefore, if the data bits D2 and D3 are equal then REFERENCE pulse 717 is low. But if data bits D2 and D3 are not equal, then REFERENCE bit 717 is high.

For random data, each data bit may be high or low with equal probability and may change state or remain constant at each transition, also with equal probability. Thus, each ERROR pulse, such as 712, has an equal probability of being high or low. Also each REFERENCE signal pulse, such as 717, has an equal probability of being high or low. If the DATA transitions are aligned with the rising edge of the CLOCK 710, the ERROR signal 770 and the REFERENCE signal 780 are each low half the time and either high or low with equal probability the other half. This means that the ERROR -signal 770 and REFERENCE signal 780 each have an average AC value equal to one-fourth their AC peak value.

If the data is not random, for instance if DATA 720 consists of a long string of either high or low data bits, then ERROR pulses, such as 712, and REFERENCE pulses, such as 717 are low. The ERROR and REFERENCE signals' average values are at a minimum. But if the data changes every bit, then each ERROR signal pulse and each REFERENCE bit is high. Therefore, the ERROR and REFERENCE signals are equal to one-half their peak values. Thus, the ERROR signal and the REFERENCE signal have the same data pattern dependency, while the ERROR signal also tracks the phase error. This means the data dependency of ERROR signal 770 can be corrected by subtracting the REFERENCE signal 780. The difference signal between ERROR and REFERENCE is not dependent on the data pattern, but is dependent on the phase error. This resulting signal has approximately a zero value when the edges of the DATA signal are aligned with the CLOCK rising edges. As the DATA is delayed, the differential value becomes negative. As the DATA advances, the difference becomes positive.

Each data bit has a duration $t_1$ 743. The reciprocal of the data bit duration $t_1$ 743 is referred to as the data rate. Each CLOCK period has a duration $t_2$ 747, where $t_2$ is equal to $t_1$. The CLOCK frequency is the reciprocal of the duration $t_2$ 747. Thus, the CLOCK frequency is equal to the data rate.

Various modifications will be obvious to one skilled in the art. For example, a CLOCK signal with a reversed polarity may be used, such that the transitions of the data align with the CLOCK falling edges.

Figure 8:
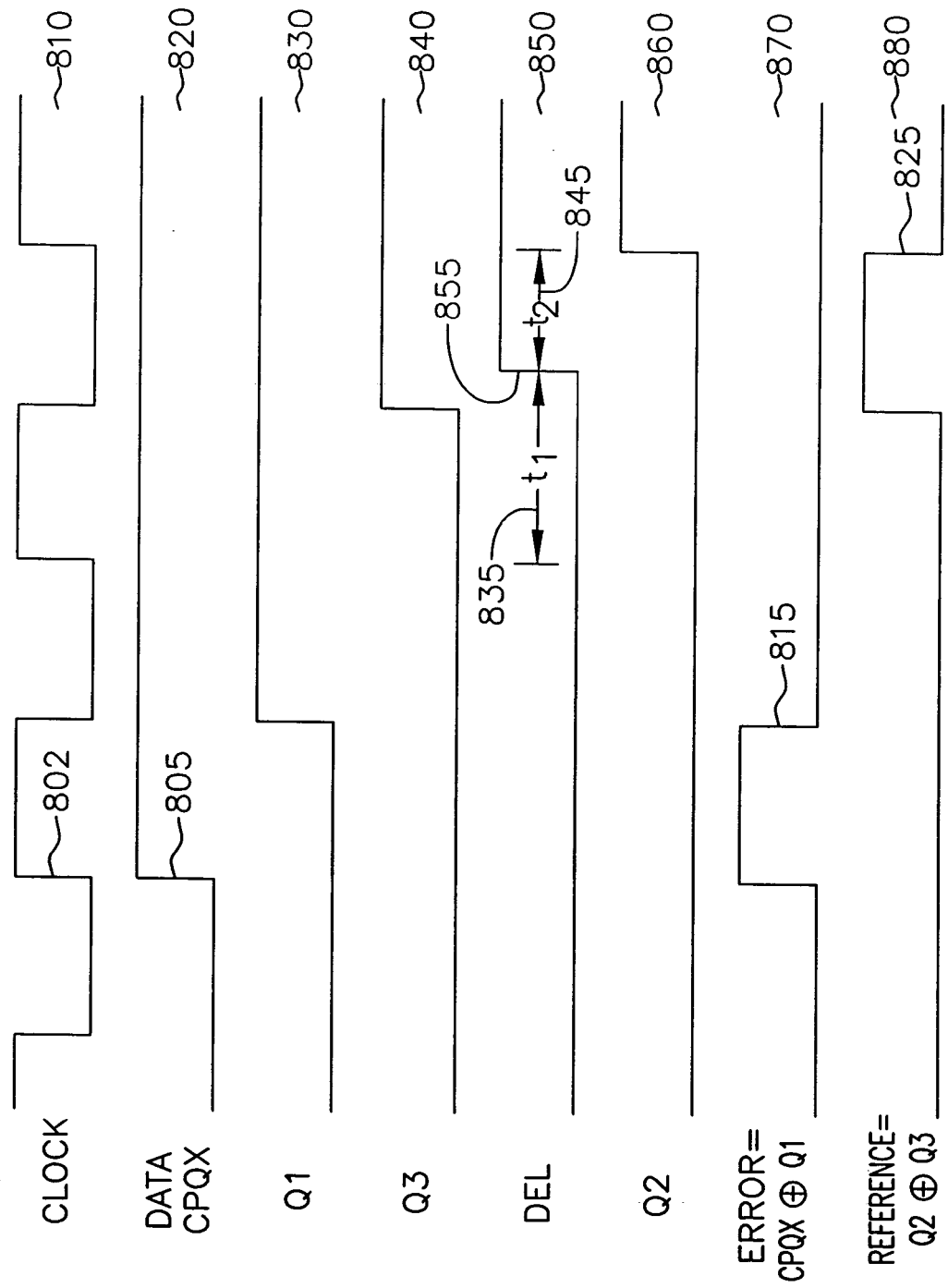
FIG. 8 illustrates the timing diagram of FIG. 7 with a specific data pattern, and no phase error.

FIG. 8 is the timing diagram of FIG. 7 for a specific data transition 805. Included are inputs CLOCK 810 and DATA 820, and resulting signals Q1 830, Q3 840, DEL 850, Q2 860, ERROR 870, and REFERENCE 880. In this example, DATA 820 transition 805 occurs at a time corresponding to the rising edge 802 of CLOCK signal 810. Q1 is equal to the DATA signal shifted in time and aligned with the next falling edge of the CLOCK 810. Q3 is equal to Q1 delayed by one CLOCK cycle. Del 850 is Q1 830 delayed in time. Ignoring any clock-to-Q or set-up and hold times, this delay is between one-half a CLOCK cycle and one and one-half CLOCK cycles. This range is shown by times $t_1$ 835 and $t_2$ 845. If DEL 850 follows Q1 830 either too closely or too remotely, the second flip-flop 350 latches the DEL signal on the wrong rising edge of the clock. As above, if the signals are generated by flip-flops, the delay between DEL 850 and Q1 830 is greater than one-half a CLOCK cycle, less a clock-to-Q delay, plus a hold time, but less than one and one-half CLOCK cycles, less a clock-to-Q delay, less a set-up time.

Q2 860 is equal to DEL 850 delayed and aligned with the next rising edge of the CLOCK signal 810. Again, the DATA signal may be delayed by a time approximately equal to the phase delay between Q1 and the falling edge of the CLOCK signal 810, resulting in the signal CPQX. The ERROR signal 870 is the XOR of CPQX and Q1 830. In some applications, the DATA signal may not need to be delayed, and the DATA signal itself may be XORed with Q1 to generate the ERROR signal. The REFERENCE signal is the XOR between Q2 860 and Q3 840. As can be seen in this diagram, an ERROR pulse 815 and a REFERENCE pulse 825 result from the data transition 805.

Figure 9:
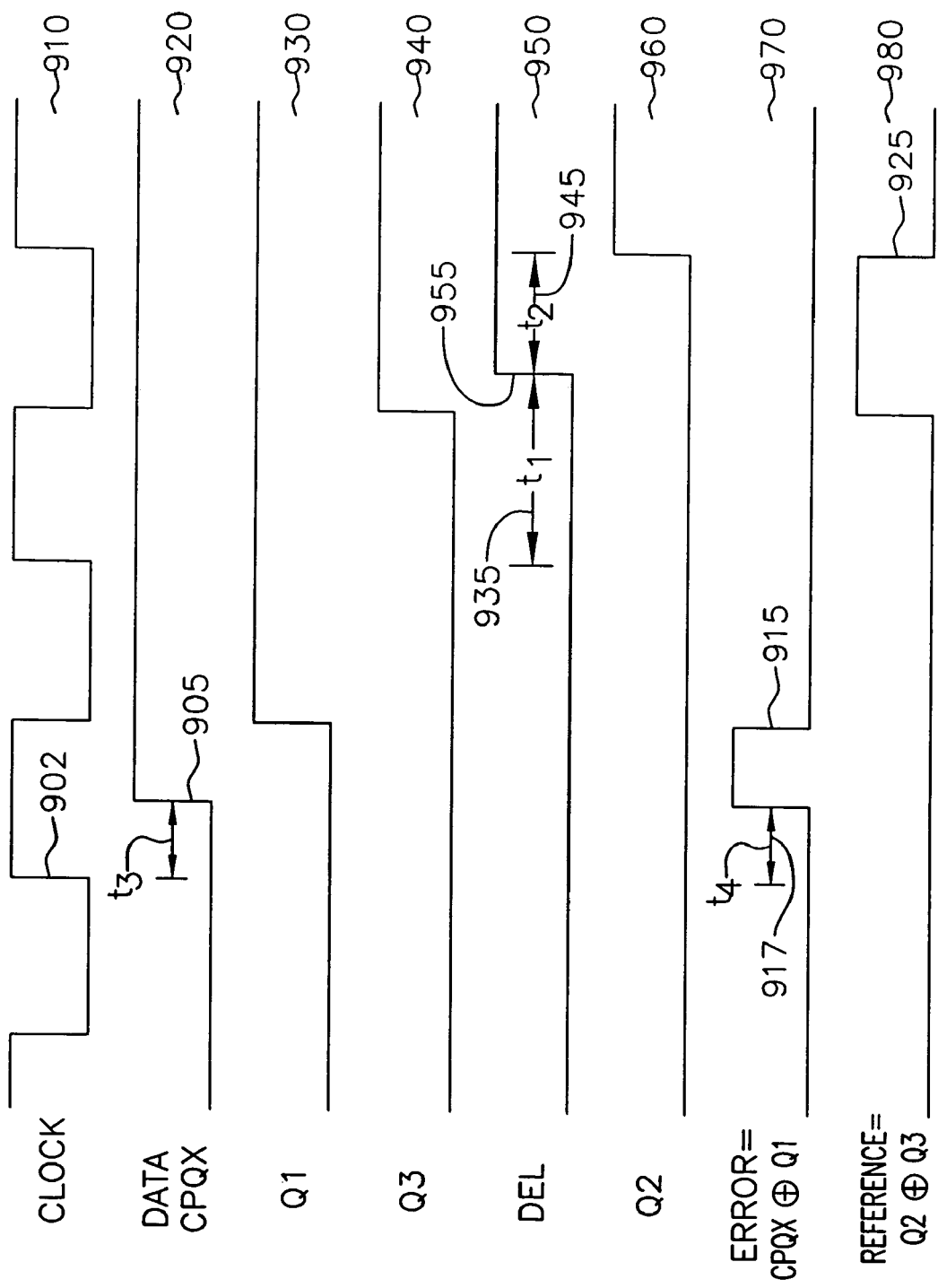
FIG. 9 is the timing diagram of FIG. 8 with a phase error introduced.

FIG. 9 is the timing diagram of FIG. 8 with a phase error $t_3$ introduced between the data transition 905 and CLOCK rising edge 902. Included are inputs CLOCK 910 and DATA 920, and resulting signals Q1 930, Q3 940, DEL 950, Q2 960, ERROR 970, and REFERENCE 980. Again, the transition 905 in DATA 920 results in a pulse in ERROR waveform 970, specifically 915, and a REFERENCE bit 925. But this time, since the DATA 920 has been delayed, ERROR pulse 915 is narrower than the corresponding pulse 815 in FIG. 8. Specifically, ERROR pulse 915 is narrower by an amount shown here as $t_4$ 917. In most cases, $t_4$ is approximately equal to $t_3$. Accordingly, the average value of ERROR signal 970 is lower than the average value of ERROR signal 870 in FIG. 8. But again, since the REFERENCE pulse 925 is defined by the falling and rising edges of the CLOCK signal 910, its width does not change as compared to REFERENCE pulse 825 in FIG. 8. Therefore, the difference between the ERROR signal and the REFERENCE signal has changed, and this difference signal is used to correct for the phase error between DATA transitions such as 905 and the rising edges of the CLOCK 910.

Figure 10:
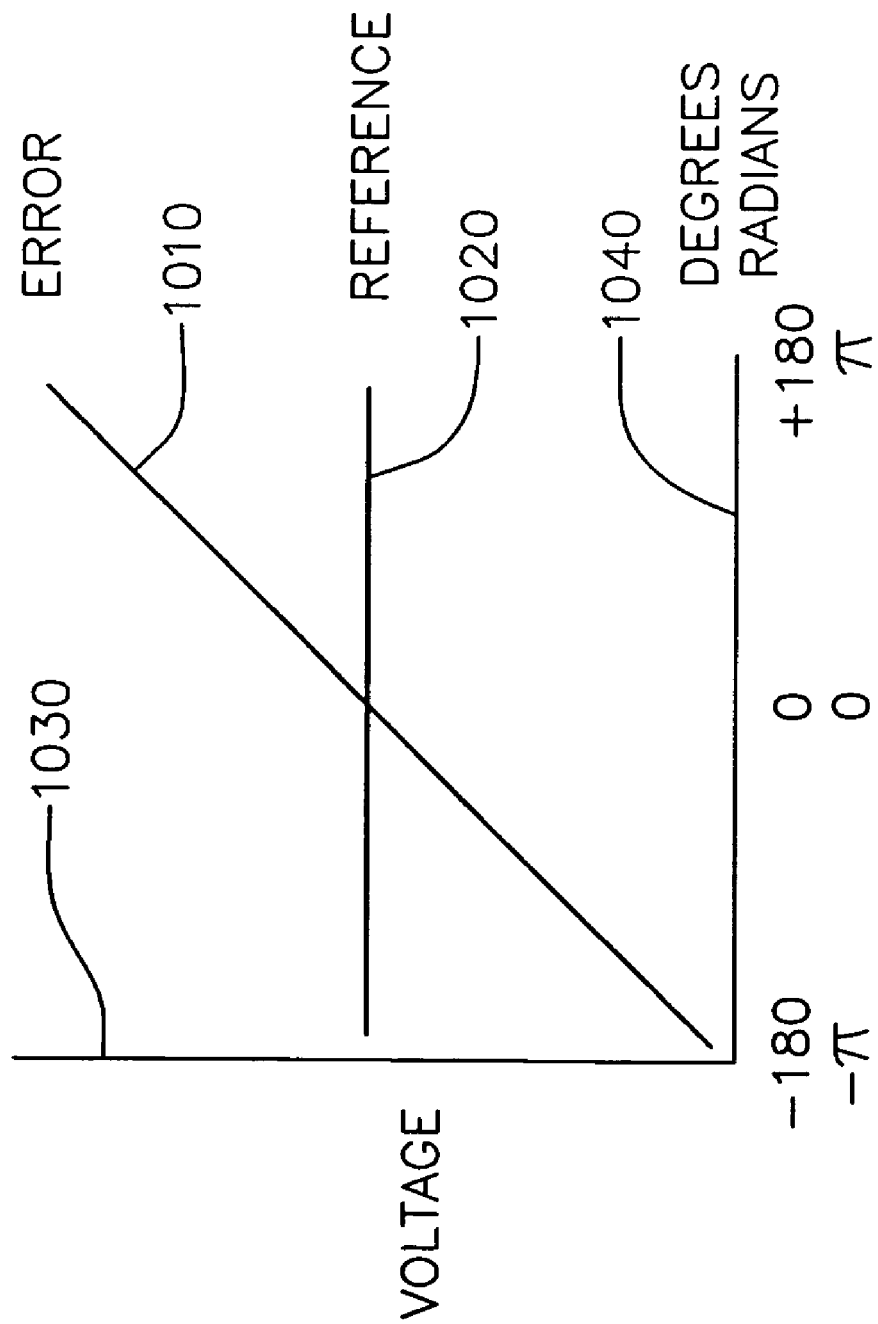
FIG. 10 shows the error and reference voltages as a function of phase error for the full-rate phase detector of FIG. 3.

FIG. 10 graphs the ERROR voltage and REFERENCE voltage outputs for a full-rate phase detector consistent with one embodiment of the present invention. The ERROR signal 1010 and REFERENCE signal 1020 voltages are graphed as a function of the phase error between the data and CLOCK signals. ERROR signal 1010 is proportional to the phase error. ERROR signal 1010 may be linear. Alternately, ERROR signal may have non-linear characteristics. REFERENCE signal 1020 is approximately independent of the phase error, but is a function of the data pattern. ERROR signal 1010 and REFERENCE signal 1020 may become discontinuous or notched when the phase error is near plus or minus 180 degrees.

FIG. 11 is a flow chart for a method detecting phase errors between a data signal and clock signal, consistent with one embodiment of the present invention. In act 1110, a data input and a clock input having-rising and falling edges is provided. The data input is stored in a first flip-flop on the clock falling edges in act 1120. In act 1130 the first flip-flop's output is stored in a third flip-flop on the clock falling edges. The first flip-flop's output is delayed in act 1140, and this delayed output is stored in a second flip-flop on the clock rising edges. The data signal and the first flip-flop's output are XORed to generate an error signal in act 1160. In act 1170 the second and third flip-flop's outputs are XORed to generate a reference signal.

It will be obvious to one skilled in the art, that various modifications and additions can be made to this flow chart. For example in generating the error signal, the data signal may be delayed as to match the first flip-flop's clock-to-Q delay. Also, the error and reference signals may be applied to a charge pump, or directly to a loop filter in order to generate a VCO control voltage.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. A circuit for detecting phase errors between a data signal and a clock signal to facilitate the recovery of data from a data signal comprising:
   a first storage device receiving the data signal;
   a first delay block coupled to the first storage device;
   a second storage device coupled to the first delay block;
   a third storage device coupled to the first storage device;
   a second delay block receiving the data signal;
   a first logic gate coupled to the second storage device and the third storage device; and
   a second logic gate coupled to the second delay block and the first storage device,
   wherein the first logic gate and the second logic gate are configured to perform exclusive-OR operations on received signals
   wherein a clock-to-Q delay of the first storage device and a trace coupling the first storage device to the second logic gate matches a delay through the second delay block and a
   trace coupling the second delay block to the second logic gate,
   wherein a clock-to-Q delay of the second storage device and a trace coupling the second storage device to the first logic gate matches a clock-to-Q delay of the third storage device and a trace coupling the third storage device to the first logic gate.

2. The circuit of claim 1, wherein the first logic gate generates a reference signal, the second logic gate independently generates an error signal.

3. The circuit of claim 2, further comprising applying the error signal and the reference signal to a loop filter to generate a loop filter output.

4. The circuit of claim 1, further comprising one or more capacitors interposed between the second delay block and the second logic gate.

5. The circuit of claim 1, wherein the second storage device and the third storage device are substantially identical.

6. The circuit of claim 1, wherein the first logic gate and the second logic gate are substantially identical.

7. The circuit of claim 1, wherein the delay through the second delay block is approximately equal to the clock-to-Q delay of the first storage device.

8. The circuit of claim 1, wherein the delay through the second delay block is longer than the clock-to-Q delay of the first storage device.

9. The circuit of claim 8, wherein the delay through the second delay block is approximately one-half a reciprocal of a frequency of the clock signal.

10. The circuit of claim 1, wherein a delay through the first delay block is approximately equal to the time between a rising edge of the clock signal and a falling edge of the clock signal.

11. The circuit of claim 1, wherein the data signal is received through an input configured to receive a differential signal.

12. The circuit of claim 11, wherein the clock signal is received through an input configured to receive a differential signal.

13. A method of decoupling the generation of a reference signal and an error signal used to detect phase errors between a data signal and a clock signal, the method comprising:
   providing a data input and a clock input having a rising edge and a falling edge;
   storing the data input in a first flip-flop on the falling edge of the clock input;
   storing the output of the first flip-flop in a third flip-flop on the falling edge of the clock input;
   delaying the output of the first flip-flop with a delay block coupled with the first flip-flop;
   storing the delayed output of the first flip-flop in a second flip-flop on the rising edge of the clock input;
   delaying the data signal to produce a delayed data signal;
   taking the exclusive-OR of the delayed data signal and the first flip-flop output to generate a error signal; and
   taking the exclusive-OR of the outputs of the second and third flip-flops to generate a reference signal.

14. The method of claim 13, further comprising applying the error signal and the reference signal to a loop filter to generate a loop filter output.

15. The method of claim 13, wherein the data signal is delayed for a period approximately equal to a clock-to-Q delay of the first flip-flop.

16. The method of claim 13, wherein the data signal is delayed for a longer period than a clock-to-Q delay of the first flip-flop.

17. The method of claim 16, wherein the data signal is delayed for a period of approximately one-half a reciprocal of a frequency of the clock signal.

18. The method of claim 13, wherein the output of the first flip-flop is delayed for a period approximately equal to the time between a rising edge of the clock signal and a falling edge of the clock signal.

19. The method of claim 13, wherein the data input is configured to receive a differential signal.

20. The method of claim 19, wherein the clock input is configured to receive a differential signal.

* * * * *